United States Patent
Sohn et al.

(10) Patent No.: US 7,172,823 B2
(45) Date of Patent: Feb. 6, 2007

(54) BLUE ELECTROLUMINESCENT POLYMER AND ORGANO-ELECTROLUMINESCENT DEVICE EMPLOYING THE SAME

(75) Inventors: Byung-hee Sohn, Yongin-si (KR); Sang-hoon Park, Seongnam-si (KR); Soo-Hyoung Lee, Suwon-si (KR); In-sung Song, Yongin-si (KR); Jhun-mo Son, Yongin-si (KR); Woon-jung Paek, Daejeon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 258 days.

(21) Appl. No.: 10/743,820

(22) Filed: Dec. 24, 2003

(65) Prior Publication Data

US 2004/0137271 A1  Jul. 15, 2004

(30) Foreign Application Priority Data

Dec. 24, 2002  (KR)  .................... 10-2002-0083186

(51) Int. Cl.
*H05B 33/12* (2006.01)
*C08G 61/12* (2006.01)

(52) U.S. Cl. .................. 428/690; 428/917; 313/504; 313/506; 257/40; 257/103; 528/423

(58) Field of Classification Search ............. 428/690, 428/917; 257/103, 40; 313/504, 506; 528/423
See application file for complete search history.

(56) References Cited

U.S. PATENT DOCUMENTS

| 5,843,607 A | * | 12/1998 | Hu et al. ............ 430/58.5 |
| 5,932,363 A | * | 8/1999 | Hu et al. ............ 428/690 |
| 5,942,340 A | * | 8/1999 | Hu et al. ............ 428/690 |
| 6,169,163 B1 | | 1/2001 | Woo et al. ............ 528/397 |

OTHER PUBLICATIONS

Sainova et al. Control of Color and Efficiency, etc.., Applied Physics Letters, vol. 76, No. 14, Apr. 2000, pp. 1810-1812.
Stephan et al. Blue light electroluminescent devices based on a copolymer, etc . . . , Synthetic Metals 106 (1999), pp. 115-119.

* cited by examiner

*Primary Examiner*—Rena Dye
*Assistant Examiner*—Camie S. Thompson
(74) *Attorney, Agent, or Firm*—Lee & Morse, P.C.

(57) ABSTRACT

A blue electroluminescent polymer having an indolocarbazole unit in the backbone of a polyarylene polymer and an organo-electroluminescent device using the same.

8 Claims, 7 Drawing Sheets

BLUE ELECTROLUMINESCENT POLYMER AND ORGANO-ELECTROLUMINESCENT DEVICE EMPLOYING THE SAME

BACKGROUND OF THE INVENTION

1. Field of the Invention

Embodiments of the present invention relate to a blue electroluminescent polymer and an organo-electroluminescent device employing the same. More particularly, embodiments of the invention relate to a blue electroluminescent polymer having an indolocarbazole unit in the backbone of a polyarylene polymer, and an organo-electroluminescent device that offers improved emission efficiency and color purity.

2. Description of the Related Art

An organo-electroluminescent device (hereinafter "an organic EL") is an active drive type emission display device using a phenomenon that when current is applied to fluorescent or phosphorescent organic compound layers (hereinafter "organic layers"), electrons and holes are combined in the organic layers to then emit light. Organic EL devices have various advantages, such as being lightweight, simple components with simplified fabrication processes, a wide range of colors with high luminescence. Also, organic EL devices can provide moving picture displays perfectly with high color purity and have electrical properties suitable for use in portable electronic devices at low power consumption and low driving voltage.

Such organic EL devices can be classified into low molecular weight organic EL devices and polymer organic EL devices, depending on their fabrication materials. Low molecular weight organic EL devices are advantageous because emissive compounds can easily be synthesized and purified to a high degree, and color pixels can easily be obtained. For practical application of low molecular weight organic EL devices, however, there still remains room for improvement in quantum efficiency and color purity, and there is a need to prevent crystallization of thin layers.

In polymer organic EL devices, a thin layer can be formed easily by spin coating or printing, so that such polymer organic EL devices can be fabricated in a simplified manner at low costs. In addition, organic layers formed during the manufacture of polymer organic EL devices exhibit good mechanical properties.

Such polymer organic EL devices, however, have several problems including low color purity, high drive voltage, and low emission efficiency. To overcome these problems, vigorous research is under way.

SUMMARY OF THE INVENTION

The present invention provides a compound easily capable of moving charges and having improved emission efficiency, and an organic EL device with improved color purity and emission efficiency by employing the compound.

In accordance with an embodiment of the present invention, there is provided a polymer represented by formula 1:

<Formula 1> wherein Ar is selected from the group consisting of a substituted or unsubstituted $C_{6-30}$ aryl group and a substituted or unsubstituted $C_{2-30}$ heteroaryl group; $R_1$, $R_2$, $R_3$ and $R_4$ are independently a hydrogen atom, a substituted or unsubstituted $C_{1-30}$ alkyl group, a substituted or unsubstituted $C_{1-30}$ alkoxy group, a substituted or unsubstituted $C_{6-30}$ aryl group, a substituted or unsubstituted $C_{6-30}$ arylalkyl group, a substituted or unsubstituted $C_{6-30}$ aryloxy group, a substituted or unsubstituted $C_{2-30}$ heteroaryl group, a substituted or unsubstituted $C_{2-30}$ heteroarylalkyl group, a substituted or unsubstituted $C_{2-30}$ heteroaryloxy group, a substituted or unsubstituted $Cr_{5-20}$ cycloalkyl group, and a substituted or unsubstituted $C_{5-30}$ heterocycloalkyl group; and n is a real number between 0.01 and 0.99.

In accordance with another embodiment of the present invention, there is provided an organic EL device comprising an organic layer positioned between a pair of electrodes, the organic layer containing the above-described polymer represented by formula 1.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Priority Korean Patent Application No. 2002-83186, filed on Dec. 24, 2002, and entitled "Blue Electroluminescent Polymer and Organo-Electroluminescent Device Employing the Same," is incorporated by reference herein in its entirety.

Preferred embodiments of the present invention will be described in detail below.

A polymer represented by formula 1 according to a preferred embodiment of the present invention comprises an indolocarbazole unit in its main polyarylene chain that can exhibit good charge transporting capability, in particular, hole transporting capability and a blue electroluminescent property:

<Formula 1> wherein Ar is selected from the group consisting of a substituted or unsubstituted $C_{6-30}$ aryl group and a substituted or unsubstituted $C_{2-30}$ heteroaryl group; $R_1$, $R_2$, $R_3$ and R4 are independently a hydrogen atom, a substituted or unsubstituted $C_{1-30}$ alkyl group, a substituted or unsubstituted $C_{1-30}$ alkoxy group, a substituted or unsubstituted $C_{6-30}$ aryl group, a substituted or unsubstituted $C_{6-30}$ arylalkyl group, a substituted or unsubstituted $C_{6-30}$ aryloxy group, a substituted or unsubstituted $C_{2-30}$ heteroaryl group, a substituted or unsubstituted $C_{2-30}$ heteroarylalkyl group, a substituted or unsubstituted $C_{2-30}$ heteroaryloxy group, a substituted or unsubstituted $C_{5-20}$ cycloalkyl group, and a substituted or unsubstituted $C_{5-30}$ heterocycloalkyl group; and n is a real number between 0.01 and 0.99.

The arylene (Ar) unit in the backbone of the blue electroluminescent polymer is preferably a group represented by the following formulas:

(1a)

(1b)

(1c)

(1d)

(1e)

(1f)

(1g)

(1h)

(1i)

(1j)

-continued (1k)

(1m)

wherein $R_5$ and $R_6$ are independently selected from the group consisting of a hydrogen atom, a substituted or unsubstituted $C_{1-12}$ alkyl group, a substituted or unsubstituted $C_{1-12}$ alkoxy group and a substituted or unsubstituted amino group.

The arylene (Ar) unit in the main chain of the blue electroluminescent polymer according to a preferred embodiment of the present invention more preferably has an alkyl fluorene structure as represented by formula 1 k or 1 m, for example. The fluorene structure has good fluorescent properties, when compared to other aromatic structures, and provides good chemical flexibility. For example, the fluorene structure can easily accept the introduction of various substituents at 9,9' positions thereof, including an alkyl group, which serves as a solubilizing moiety.

A particularly preferred example of the compound represented by formula 1 is a polymer represented by formula 2:

<Formula 2> wherein $R_1$, $R_2$, $R_7$ and $R_8$ are independently a $C_{1-12}$ alkyl group, and n is a real number between 0.01 and 0.99.

Figure 1:
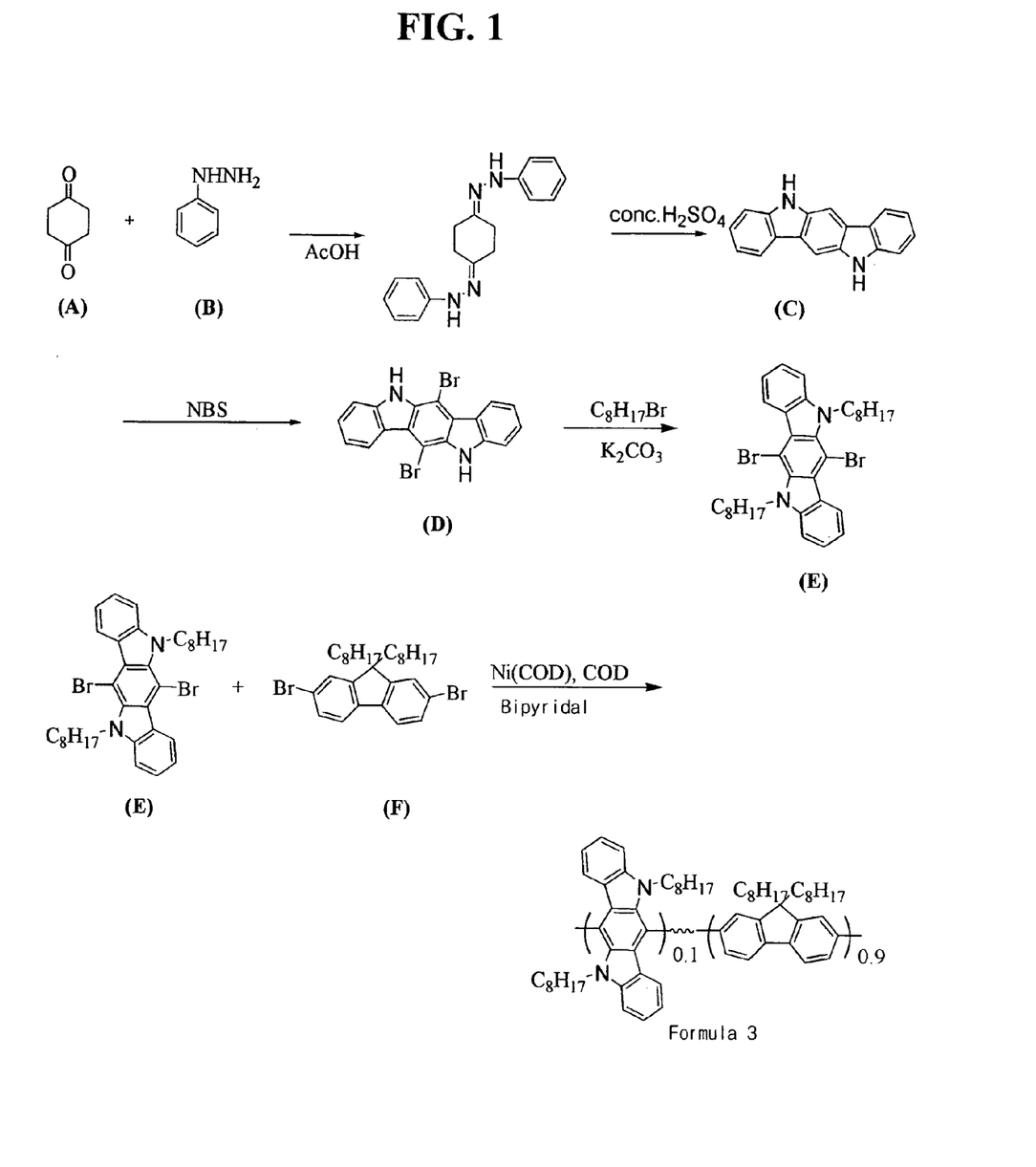
FIG. 1 is a schematic diagram illustrating the synthesis of indolocarbazole monomers and poly(dioctylfluorene-co-indolocarbazole) using the same, according to Preparation Examples 1–3.

The polymer represented by formula 2 includes 9,9'-dioctylfluorene introduced as the arylene unit. A preferred synthesis route for the polymer of formula 2 is shown in FIG. 1.

The weight average molecular weight of an emissive polymer is a factor that may be important in determining the characteristics of a thin film formed using the polymer, and in determining the lifetime of a device. In the context of the foregoing, the blue electroluminescent polymer according to the present invention preferably has a weight average molecular weight of approximately 10,000 to 200,000. If the weight average molecular weight of the blue electroluminescent polymer is less than about 10,000, a thin film may be crystallized during the manufacture and driving of a device. If the weight average molecular weight of the blue electroluminescent polymer is greater than about 200,000, it may become quite difficult to manufacture the polymer under normal preparation conditions using a Pd(O) or Ni(O)-mediated aryl coupling reaction, and undesirable electroluminescence characteristics of an organic EL device employing the polymer may be exhibited.

It is known that a narrower molecular weight distribution (MWD) of an emissive polymer is advantageous in view of electroluminescence characteristics (specifically the lifetime of a device). Preferably, the blue electroluminescent polymer according to the present invention has a MWD of 1.5 to 5.

Examples of suitable unsubstituted $C_{1-30}$ alkyl groups as a substituent group for a compound according to various embodiments of the present invention include methyl, ethyl, propyl, isobutyl, sec-butyl, pentyl, iso-amyl, hexyl, etc., wherein at least one hydrogen atom of the alkyl group may be substituted with halogen atom, a hydroxy group, a nitro group, a cyano group, a substituted or unsubstituted amino group, (such as —$NH_2$, —NH(R) or —N(R')(R")in which R' and R" are independently a $C_{1-10}$ alkyl group), an amidino group, hydrazine, hydrazone, a carboxy group, a sulfonic acid group, a phosphoric acid group, a $C_{1-20}$ alkyl group, a $C_{1-20}$ halogenated alkyl group, a $C_{1-20}$ alkenyl group, a $C_{1-20}$ alkynyl group, a $C_{1-20}$ heteroalkyl group, a $C_{6-20}$ aryl group, a $C_{6-20}$ arylalkyl group, a $C_{6-20}$ heteroaryl group, a $C_{6-20}$ heteroarylalkyl group, etc.

Suitable aryl groups that can be used as a substituent group for a compound according to preferred embodiments of the present invention include those having a $C_{6-30}$ carbocyclic aromatic system containing at least one ring wherein the rings may be attached together in a pendent manner or may be fused. Examples of aryl groups include aromatic systems, such as phenyl, naphthyl, tetrahydronaphthyl, etc. At least one hydrogen atom of the aryl group can be substituted with any substituent group described above as being suitable for the $C_{1-30}$ alkyl group.

Suitable heteroaryl groups useful as substituent groups for a compound according to preferred embodiments of the present invention include 5–30 membered aromatic cyclic systems containing one, two, or three hetero atoms selected from the group consisting of N, O, P, and S and having at least one ring wherein such rings may be attached together in a pendent manner or may be fused. At least one hydrogen atom of the heteroaryl group can be substituted with any substituent group described above as being suitable for the $C_{1-30}$ alkyl group.

Examples of suitable unsubstituted $C_{1-30}$ alkoxy groups as a substituent group for a compound according to an embodiment of the present invention include methoxy, ethoxy, propoxy, isobutyl, sec-butyloxy, pentyloxy, iso-amyloxy, hexyloxy, etc, wherein at least one hydrogen atom of the alkoxy group can be substituted with any substituent group described above as being suitable for the $C_{1-30}$ alkyl group.

The arylalkyl group as a substituent group for a compound according to a preferred embodiment of the present invention typically denotes the above-defined aryl group having lower alkyl substitute groups, for example, methyl, ethyl, propyl, etc. for some hydrogen atoms. Examples of an arylalkyl group include benzyl, phenylethyl, etc. At least one hydrogen atom of the arylalkyl group may be substituted with any substituent group described above as being suitable for the $C_{1-30}$ alkyl group.

The heteroarylalkyl group as a substituent group for a compound according to an embodiment of the present invention typically denotes the above-defined heteroaryl group having lower alkyl substitute groups for some hydrogen atoms. Examples of a heteroarylalkyl group include benzyloxy, phenylethyloxy, etc. At least one hydrogen atom of the heteroarylalkyl group can be substituted with any substituent group described above as being suitable for the $C_{1-30}$ alkyl group.

The cycloalkyl group as a substituent group for a compound according to an embodiment of the present invention includes, for example, a $C_{5-30}$ monovalent monocyclic system, wherein at least one hydrogen atom of the cycloalkyl group can be substituted with any substitute group described above as being suitable for the $C_{1-30}$ alkyl group.

The heterocycloalkyl group as a substituent group for a compound according to an embodiment of the present invention includes a 5–30 membered cyclic system containing one, two, or three hetero atoms selected from the group consisting of N, O, P, and S and having lower alkyl substitute groups for some hydrogen atoms. At least one hydrogen atom of the heterocycloalkyl group can be substituted with any substitute group described above as being suitable for the $C_{1-30}$ alkyl group.

An organo-electroluminescent (EL) device employing a preferred blue electroluminescent polymer represented by formula 1 according to the present invention, and a method of manufacturing the blue electroluminescent polymer now will be described.

FIGS. 2A through 2F are views schematically illustrating laminated structures of organo-electroluminescent (EL) devices manufactured in the Examples of preferred embodiments of the present invention.

Figure 2A:
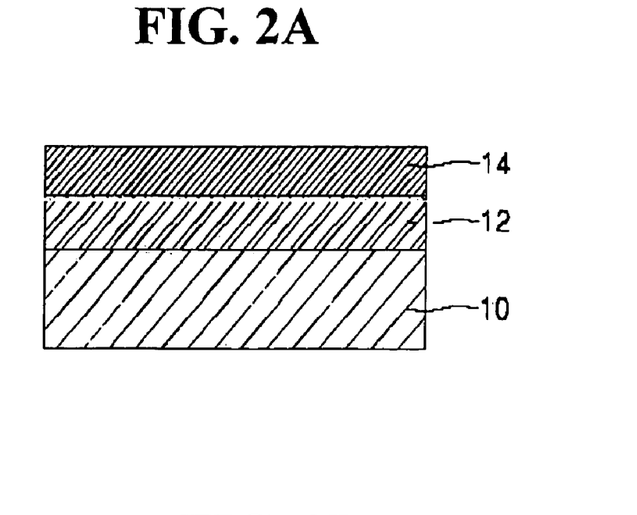
FIGS. 2A through 2F are views schematically illustrating laminated structures of organo-electroluminescent (EL) devices manufactured in Examples of the invention.
Figure 2B:
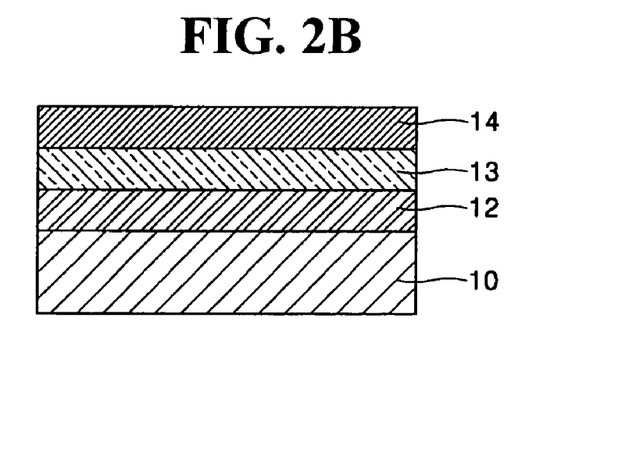

Referring now to FIG. 2A, an emissive layer 12 having a blue electroluminescent polymer represented by formula 1 preferably is laminated on a first electrode 10 and a second electrode 14 then preferably is formed on the emissive layer 12. Referring to FIG. 2B, a hole blocking layer (HBL) 13 can be laminated on the emissive layer 12 having the blue electroluminescent polymer represented by formula 1 laminated on the first electrode 10, and then the second electrode 14 formed on the HBL 13.

Figure 2C:
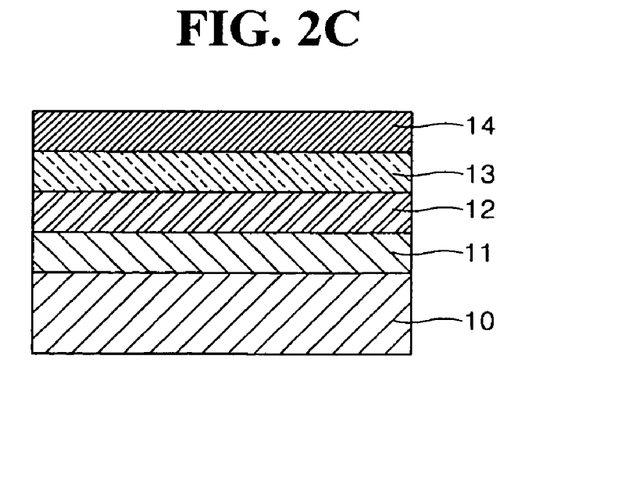
Figure 2D:
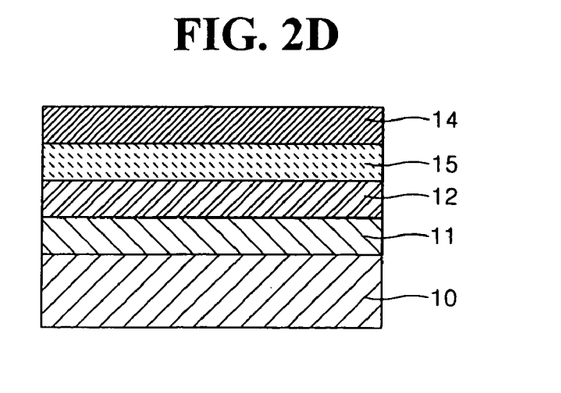

Referring to FIG. 2C, a hole injection layer (HIL) (also referred to herein as a buffer layer) 11 can be formed between the first electrode 10 and the emissive layer 12. The organic EL device shown in FIG. 2D has the same laminated structure as that shown in FIG. 2C except that an electron transport layer (ETL) 15, instead of the HBL 13, is formed on the emissive layer 12. The organic EL device shown in FIG. 2E has the same laminated structure as that shown in FIG. 2C except that a dual layer having a HBL 13 and an ETL 15, preferably sequentially laminated, instead of the HBL 13, is formed on the emissive layer 12 having the blue electroluminescent polymer represented by formula 1.

Figure 2E:
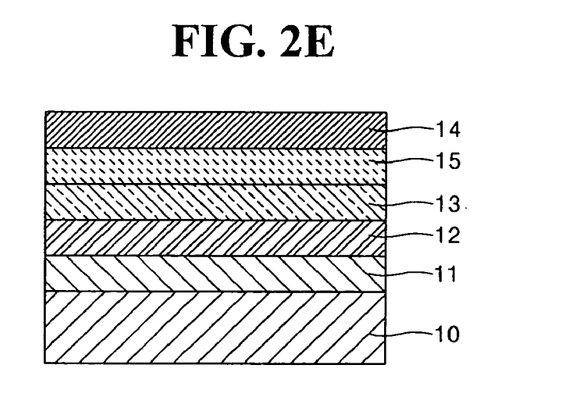
Figure 2F:
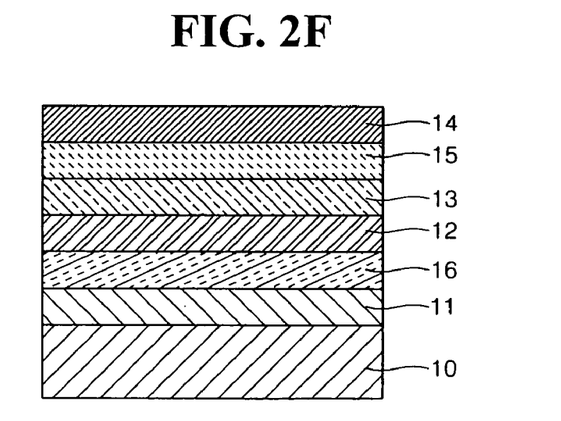

The organic EL device shown in FIG. 2F has the same laminated structure as that shown in FIG. 2E except that a hole transport layer (HTL) 16 is further formed between the HIL 11 and the emissive layer 12. Here, the HTL 16 serves to prevent impurity from infiltrating from the HIL 11 to the emissive layer 12. Those skilled in the art are capable of forming any of the layers described herein using techniques known in the art, coupled with the guidelines provided herein.

The organic EL device according to the present invention can be manufactured by, but is not limited to, conventional methods. A method of manufacturing an organic EL device according to a preferred embodiment of the present invention now will be described.

A first electrode 10 preferably is patterned on a substrate (not shown).

The substrate can be any substrate used in a conventional organic EL device, preferably a glass substrate or a transparent plastic substrate, which is transparent and has surface smoothness, manageability and is waterproof. Examples of suitable substrates include a glass substrate, a polyethyleneterephthalate substrate, a polycarbonate substrate and polyimide substrate. The substrate preferably has a thickness of 0.3 to 1.1 mm.

Any material commonly used in the field can be employed as the first electrode 10. In the case where the first electrode 10 is a cathode, it preferably is comprised of a conductive metal capable of easily injecting holes or an oxide thereof. Preferred materials for the first electrode 10 include, but are not limited to, ITO (Indium Tin Oxide), IZO (Indium Zinc Oxide), nickel (Ni), platinum (Pt), gold (Au) and iridium (Ir).

The substrate having the first electrode 10 then preferably is cleaned, and $UV/O_3$ treatment is then performed. In cleaning the substrate, an organic solvent such as isopropanol (IPA) or acetone may be used.

A hole injection layer 11 then preferably is selectively formed on the first electrode 10 of the cleaned substrate. Forming the hole injection layer 11 in such a manner is believed to increase contact resistance between the first electrode 10 and the emissive layer 12, and improve the hole transporting capability of the first electrode 10 with respect to the emissive layer 12. These features are believed to improve the driving voltage and lifetime characteristic of a device. Any material commonly used in the field can be employed as the hole injection layer 11. Preferred materials for the hole injection layer 11 include, but are not limited to, PEDOT {poly(3,4-ethylenedioxythiophene)}/PSS(polystyrene parasulfonate), starburst materials, copper phthalocyanine, polythiophene, polyaniline, polyacetylene, polypyrrole, polyphenylene vinylene, or derivatives of these compounds.

The materials for the hole injection layer preferably are spin-coated on the first electrode 10 and dried, thereby forming a hole injection layer 11. The hole injection layer 11 preferably has a thickness of 300–2000 Å, more preferably 500–1100 Å. If the thickness of the hole injection layer 11 is not the range specified above, hole injection capability may be undesirably poor. The drying is preferably formed at a temperature within the range of from about 100 to about 250° C.

The emissive layer 12 preferably is formed by spin-coating an emissive layer forming composition on the hole injection layer 11, and then drying. The emissive layer forming composition preferably comprises 0.5 to 2.0 parts by weight of polymer represented by formula 1 as an emissive material and 98.0 to 99.5 parts by weight of a solvent. Any material that can dissolve the emissive material can be used as the solvent, and examples thereof include toluene and chlorobenzene.

In some cases, the emissive layer forming composition may be mixed with a dopant. The amount of the dopant varies according to the material forming the emissive layer, and preferably 30 to 80 parts by weight based on 100 parts by weight of the materials used for forming the emissive layer such as the polymer represented by formula 1. If the amount of the dopant is not within the range specified above, electroluminescent characteristics of the EL device may undesirably deteriorate. Examples of suitable dopants include, but are not limited to, polystyrene, a polystyrene-butadione copolymer, polymethyl methacrylate, poly-α-methylstyrene, styrene-methyl methacrylate copolymer, polybutadiene, polycarbonate, polyethyleneterephthalate, polyester sulfonate, polysulfonate, polyarylate, fluorinated polyimide, transparent fluorine-based resins, transparent acryl-based resins, arylamines, peryls, pyrrols, hydrozones, carbazoles, stilbenes, starbursts, oxadiazoles, and mixtures and combinations thereof.

It is preferred that the thickness of the emissive layer 12 be adjusted to be within the range of from about 100 to about 1000 Å, more preferably 500–1000 Å, by adjusting the concentration of the emissive layer forming composition and the spin speed during spin coating. If the thickness of the emissive layer 12 is less than 100 Å, emission efficiency may be lowered.

If the thickness of the emissive layer 12 is greater than 1000 Å, the driving voltage may undesirably increase.

A hole transport layer 16 may be selectively formed between the hole injection layer 11 and the emissive layer 12. Any material having hole transporting capability can be used, and examples thereof include polytriphenylamine and the like. The thickness of the hole transport layer 16 preferably is within the range of from about 100 to about 1000 Å.

A hole blocking layer 13 and/or an electron transport layer 15 may be formed on the emissive layer 12 by evaporation or spin coating. The hole blocking layer 13 prevents excitons formed from an emissive material from migrating to the electron transport layer 15, or prevents holes from migrating to the electron transport layer 15. Examples of suitable materials for use in forming the hole blocking layer 13 include, but are not limited to, LiF, MgF$_2$, phenanthroline-based compounds, e.g., BCP manufactured by UDC Co., Ltd., imidazoles, triazoles, oxadiazoles, e.g., PBD, and aluminum complexes manufactured by UDC Co., Ltd., e.g., BAlq represented by the following formula:

Phenanthroline-containing organic compound

Imidazole-containing organic compound

Triazole-containing organic compound

Oxidiazole-containing organic compound

BAlq,

Examples of suitable material for use in forming the electron transport layer 15 include oxazoles, isooxazoles, triazoles, isothiazoles, oxadiazoles, thiadiazoles, perylenes, aluminum complexes, e.g., Alq3 (tris(8-quinolinolato)-aluminium), BAlq, SAlq, or Almq3, and gallium complexes, e.g., Gaq'2OPiv, Gaq'2OAc or 2(Gaq'2).

Perylene compound

Alq3

-continued

BAlq

SAlq

Almq3

Gaq'2OPiv

-continued

Gaq'2OAc and

2(Gaq'2)

The thickness of the hole blocking layer 13 preferably is within a range of from about 100 to 1000 Å, and the thickness of the electron transport layer 15 preferably is within the range of from about 100 to about 1000 Å. If the thicknesses of the hole blocking layer 13 and the electron transport layer 15 are not in the ranges specified above, hole blocking capability and electron transport capability may become undesirably poor.

A second electrode 14 then preferably is formed on the resultant product, followed by encapsulating, thereby completing an organic EL device.

Suitable materials useful in forming the second electrode 14 are not particularly limited, and metals having a low work function, for example, Li, Ca, Ca/Al, LiF/Ca, LiF/Al, Al, Mg, Mg alloy, may be used for deposition. The thickness of the second electrode 14 preferably is within the range of from about 50 to about 3000 Å.

The polymer represented by formula 1 according to the present invention is used not only as the material for forming an emissive layer in manufacturing the organic EL device, but also can be used as a material for forming a hole transport layer. In addition, the polymer is useful as an intermediate in bio-material preparation.

The present invention will be described in greater detail with reference to the following examples. The following examples are for illustrative purposes and are not intended to limit the scope of the invention.

PREPARATION EXAMPLE 1

Synthesis of Indolocarbazole Monomer

1. Preparation of Compound (C)

Cyclo-1,4-dione (30 g (267.5 mmol)) was dissolved in 900 ml of acetic acid a 2L flask. To a resulting solution was slowly added 57.9 ml (2.2 eq., 588.6 mmol) of phenylhydrazine (B) dropwise. The reaction was monitored by thin layer chromatography (TLC). After TLC confirmed that cyclo-1,4-dione was all removed, the reaction mixture was cooled down to approximately 5° C. Then, 142 ml (10 eq., 2.675 mol) of concentrated $H_2SO_4$ was slowly added dropwise to the reaction mixture. After addition, the reaction mixture was warmed up to approximately 80° C and reacted for an hour.

After the reaction was completed, the reaction mixture was cooled down to room temperature, followed by the addition of 300 ml of ethanol and 150 ml of distilled water, and stirred for an hour. A solid product obtained by the above process was recrystallized using ethanol to yield 25.96 g of yellow, crystalline compound (C) at 38% yield. The structure of Compound (C) was identified through $^1$H-NMR.

2 Preparation of Compound (D)

Compound (C) (22.8 g (89 mmol)) was dissolved in 1.2 L of N-methylpyrrolidinone in a 2 L flask. The mixture was warmed up to approximately 30° C., 33.3 g (186.8 mmol) of N-bromosuccinimide (NBS) was dropwise added thereto slowly and stirred for approximately 2 hours.

After the reaction was completed, 4 L of distilled water were added to the reaction mixture, and the resulting precipitate was extracted to yield a yellow solid. The yellow solid was dissolved in 1.5 L of ethyl acetate, treated with $MgSO_4$ and charcoal, and filtered through a pad of Celite. The filtrate was distilled under reduced pressure to remove unreacted solvent and filtered using 200 ml of methylene chloride to produce 15.5 g of Compound (D) as a yellow solid at 42% yield.

3 Preparation of Compound (E)

Compound (D) (10 g (24.1 mmol)), 3.25 g (57.84 mmol) of potassium carbonate, 11.17 g (1.2 eq. 57.84 mmol) of bromooctane were dissolved in 150 ml of dimethylformamide. The reaction mixture was warmed up to 150° C. and refluxed for approximately 16 hours.

Figure 3:
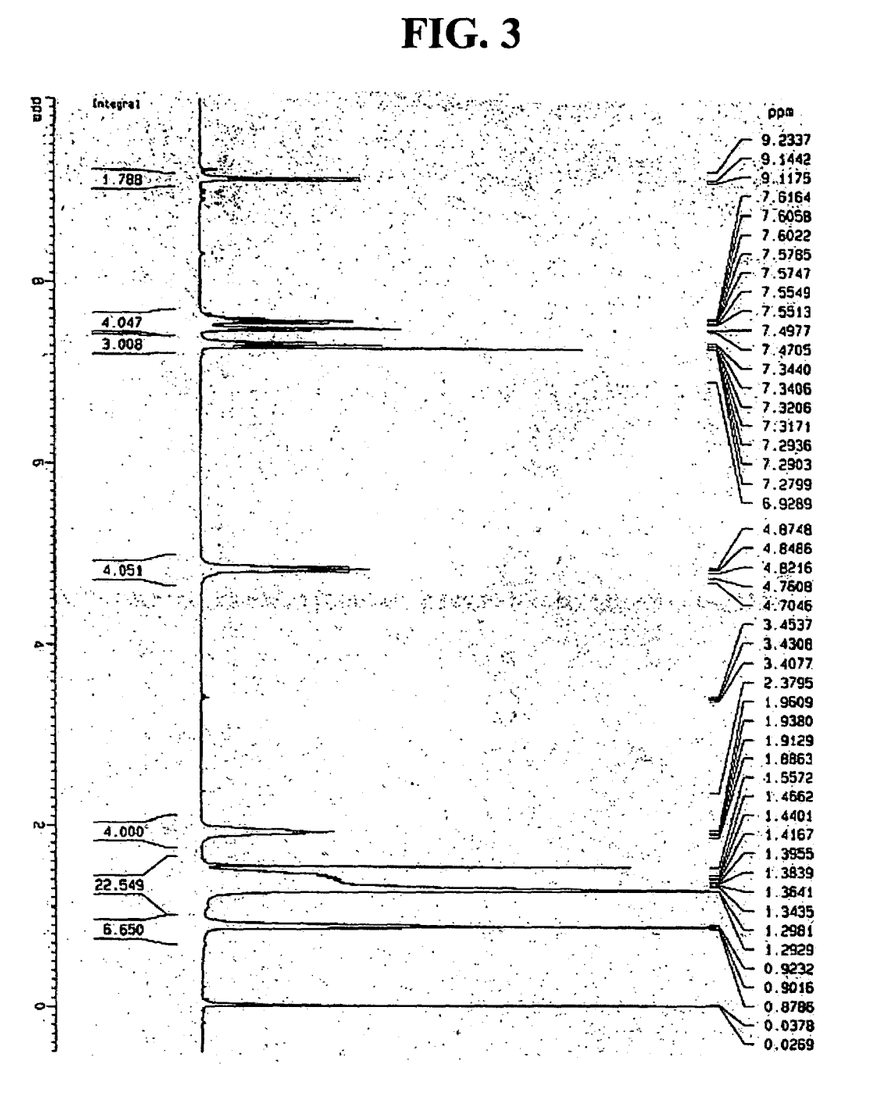
FIG. 3 is a $^1$H-NMR spectrum of compound (E) of Preparation Example 1.

After the reaction was completed, the reaction mixture was cooled down to room temperature. The cooled reaction mixture was added dropwise to 300 ml of distilled water, extracted using chloroform and washed using 300 ml of distilled water. The extracted chloroform layer was dried using $MgSO_4$. The resultant product was filtered and concentrated and was purified by silica gel column chromatography using hexane as an eluent to yield 12.77 g (20 mmol) of Compound (E) as a yellow solid at 82.9% yield. The structure of Compound (E) was identified through $^1$H-NMR. FIG. 3 shows the $^1$H-NMR spectrum of Compound (E).

$^1$H-NMR (300 MHz, $CDCl_3$): δ 0.98(s, 6H), 1.36(m, 20H), 1.91 (s, 4H), 4.80 (s, 4H), 6.92–9.15(m, 8H).

PREPARATION EXAMPLE 2

Synthesis of 9,9'-dioctyl-2,7-dibromofluorene Compound F 2,7-dibromofluorene (25 g (77 mmol)) and octylbromide were dissolved in 100 ml of toluene, and 1.25 g (3.85 ml) of tetrabutyl ammonium bromide (TBAB) was added thereto. To the resulting mixture was added NaOH aqueous solution obtained by dissolving 31 g (770 mmol) of NaOH in 50 ml of water, and was refluxed for 2 days.

After the reaction was completed, the reaction mixture was extracted using a 2:1 mixed solvent of water and $CHCl_3$ by volume to obtain an organic layer. The organic layer was dried using $MgSO_4$, and concentrated. The product was purified by silica gel column chromatography using n-hexane as an eluent. The eluent was distilled under reduced pressure to remove unreacted octylbromide to produce 40 g of Compound (F) at 95% yield. The structure of Compound (F) was identified through $^1$H-NMR.

$^1$H-NMR (300 MHz, $CDCl_3$): δ 0.65(broad s, 4H), 0.87 (m, 6H), 1.21(m, 20H) 1.93(m, 4H), 7.48(m, 4H), 7.54(m, 2H).

PREPARATION EXAMPLE 3

Synthesis of poly(dioctylfluorene-co-indolocarbazole) (90:10 by Mole) (PFIC 9)

After a flask was evacuated and refluxed with nitrogen several times to completely remove moisture therefrom, 880 mg (3.2 mmol) of bis(1,5-cyclooctaldiene)nickel (0) (to be referred to as Ni(COD)) and 500 mg (3.2 mmol) of bipyridal were transferred to the flask in a glove box, and the flask was evacuated and refluxed with nitrogen several times. To the flask was added 10 ml of anhydrous dimethyl formamide (DMF), 346 mg (3.2 mmol) of 1,5-cyclooctadiene (COD) and 10 ml of anhydrous toluene. The reaction mixture was stirred at 80° C. for 30 minutes, and a solution obtained by diluting 102 mg (0.16 mmol) of the Compound (E) obtained in Preparation Example 1 and 790 mg (1.44 mmol) of Compound (F) obtained in Preparation Example 2 in 10 ml of toluene, was added thereto. Thereafter, materials remaining on the wall of the flask were washed away by adding 10 ml of toluene to the reaction mixture, and stirred at 80° C. for 4 days, followed by adding 1 ml of bromopentafluorobenzene and further stirring at 80° C. for a day.

Figure 4:
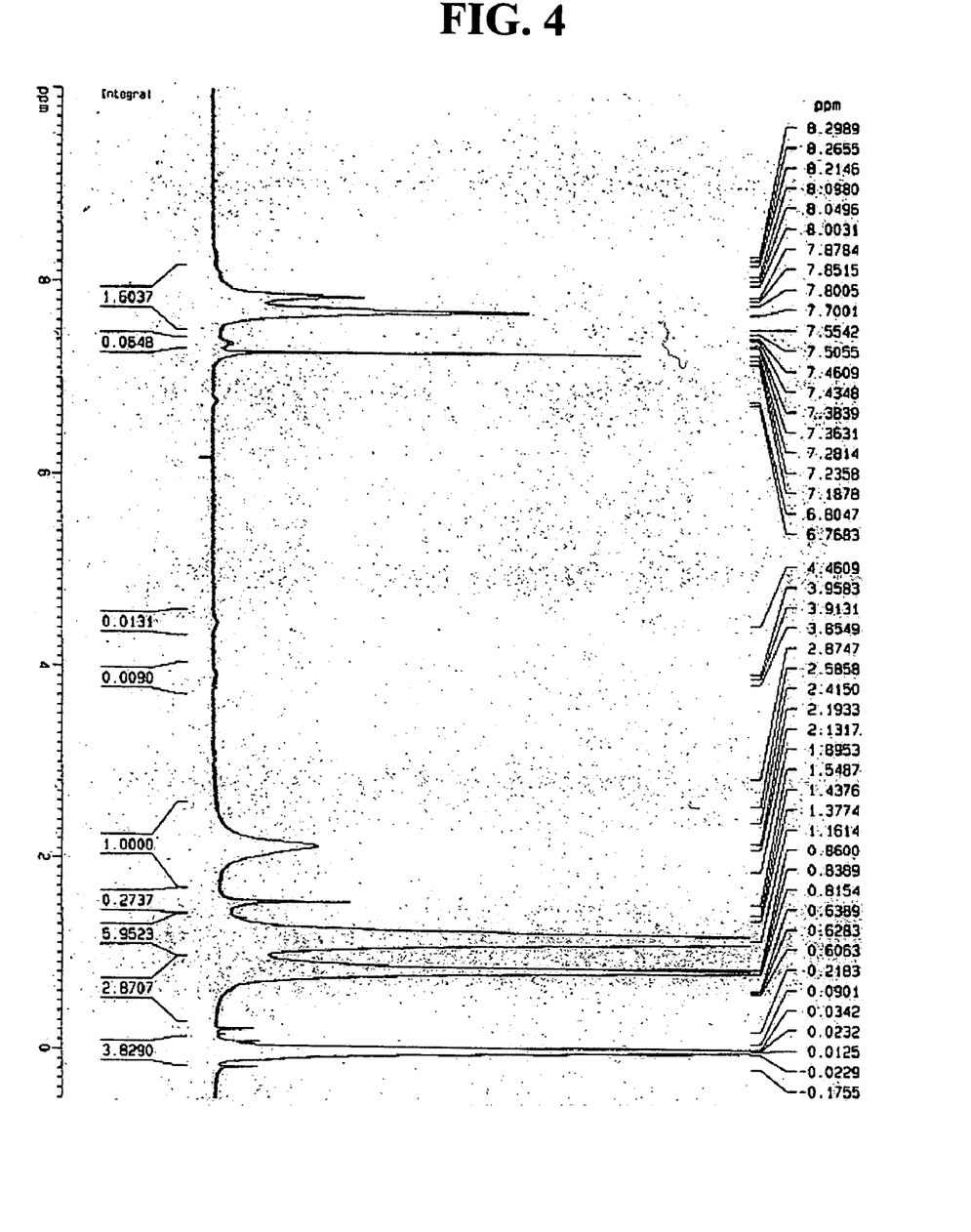
FIG. 4 is a $^1$H-NMR spectrum of poly(dioctylfluorene-co-indolocarbazole) according to Preparation Example 3.

After the stirring was completed, the reactant solution was cooled down to approximately 60° C. and poured into a 1:1:2 mixed solvent of HCl:acetone:methanol by volume to form a precipitate. The precipitate was dissolved in chloroform, and then methanol was added thereto for reprecipitation, producing 490 mg of poly(dioctylfluorene-co-indolocarbazole) represented by formula 3 at 75% yield (see FIG. 1). The obtained compound, that is, poly(dioctylfluorene-co-indolocarbazole), was analyzed by gel permeation chromatography (GPC). The analysis results showed that the compound had a weight average molecular weight of 140,000 and a polydispersity of 2.71. FIG. 4 shows the $^1$H-NMR spectrum of poly(dioctylfluorene-co-indolocarbazole).

<Formula 3>

COMPARATIVE PREPARATION EXAMPLE 1

Synthesis of poly(9,9'-dioctyl-2,7-fluorene)

After a flask was evacuated and refluxed with nitrogen several times to completely remove moisture therefrom, 880 mg (3.2 mmol) of Ni(COD) and 500 mg (3.2 mmol) of bipyridal were transferred to the flask in a glove box, and the flask was further evacuated and refluxed with nitrogen several times, followed by adding 10 ml of anhydrous DMF, 346 mg (3.2 mmol) of COD and 10 ml of anhydrous toluene under a nitrogen stream. The reaction mixture was stirred at 80° C. for 30 minutes, and a solution obtained by diluting 1.03 g (1.28 mmol) of the Compound (F) obtained in Preparation Example 2, that is, 9,9'-dioctyl-2,7-dibromofluorene in 10 ml of toluene, was added thereto. Thereafter, materials remaining on the wall of the flask were washed away by adding 10 ml of toluene to the reaction mixture, and stirred at 80° C. for 4 days, followed by the addition of 1 ml of bromopentafluorobenzene and further stirring at 80° C. for a day.

After the stirring was completed, the reactant solution was cooled down to approximately 60° C. and poured into a 1:1:2 mixed solvent of HCl:acetone:methanol by volume to form a precipitate. The precipitate was collected by gravity filtering and then dissolved in a small amount of chloroform, followed by adding methanol thereto for reprecipitation, thereby producing 450 mg of 9,9'-dioctyl-2,7-fluorene at 60% yield.

The obtained compound was analyzed by GPC. The analysis results revealed that the compound had a weight average molecular weight of 100,000 and a polydispersity of 2.64.

EXAMPLE 1

Manufacture of Organic EL Device

A transparent electrode layer coated with indium-tin oxide (ITO) was cleaned. The ITO layer was patterned into a desired shape using a photoresist resin and etchant to form an ITO electrode pattern, and cleaned. PEDOT (available from Bayer Co. under the trade name of BATRON P 4083) was coated on the patterned ITO layer to a thickness of 500 Å and baked at 180° C. for about 1 hour to form a hole injection layer.

The compound prepared in Preparation Example 3, that is, poly(dioctylfluorene-co-indolocarbazole), (0.015 g), was dissolved in 1 g of toluene to obtain an EL layer composition. The EL layer composition was spin coated on the hole injection layer, baked at 90° C. for 2 hours, and placed in a vacuum oven to fully remove the solvent, forming a polymeric emissive layer having a thickness of approximately 800 Å. Here, prior to spin coating, the EL layer composition was filtered using a 0.2 mm filter. Next, calcium and aluminum were sequentially deposited on the emissive layer in a vacuum deposition chamber at a vacuum of $4 \times 10^{-6}$ torr or less, thereby manufacturing an organic EL device, as shown in FIG. 2A. The thickness and growth rate of layers during the deposition were controlled using a crystal sensor. The resulting EL device had an emissive area of 4 mm$^2$.

COMPARATIVE EXAMPLE

Manufacture of an Organic EL Device

An EL device was manufactured in the same manner as in Example 1, except that 9,9'-dioctyl-2,7-fluorene prepared in Comparative Example 1 was used in forming the emissive layer composition, instead of poly(dioctylfluorene-co-indolocarbazole) prepared in Preparation Example 3.

Electroluminescence properties and the organic EL devices of Example 1 and Comparative Example 1 were evaluated, and the results are shown in Table 1. For evaluation of electroluminescence properties, a forward bias voltage was applied as a direct current (DC) driving voltage.

TABLE 1

|  | Example (PFIC 9) | Comparative Example 1 |
| --- | --- | --- |
| CIE (x, y) @ 100 cd/m$^2$ | (0.156, 0.159) | (0.17, 0.23) |
| Maximum luminance | 2300 cd/m$^2$ | 2300 cd/m$^2$ |
| Maximum efficiency | 0.37 cd/A | 0.25 cd/A |
| Driving voltage | 3.4 V | 3.4 V |

As shown in Table 1, the organic EL device of Example 1 had improved in maximum efficiency and color purity while maintaining the same levels of maximum luminance and driving voltage, when compared to the organic EL device of Comparative Example 1.

Figure 5A:
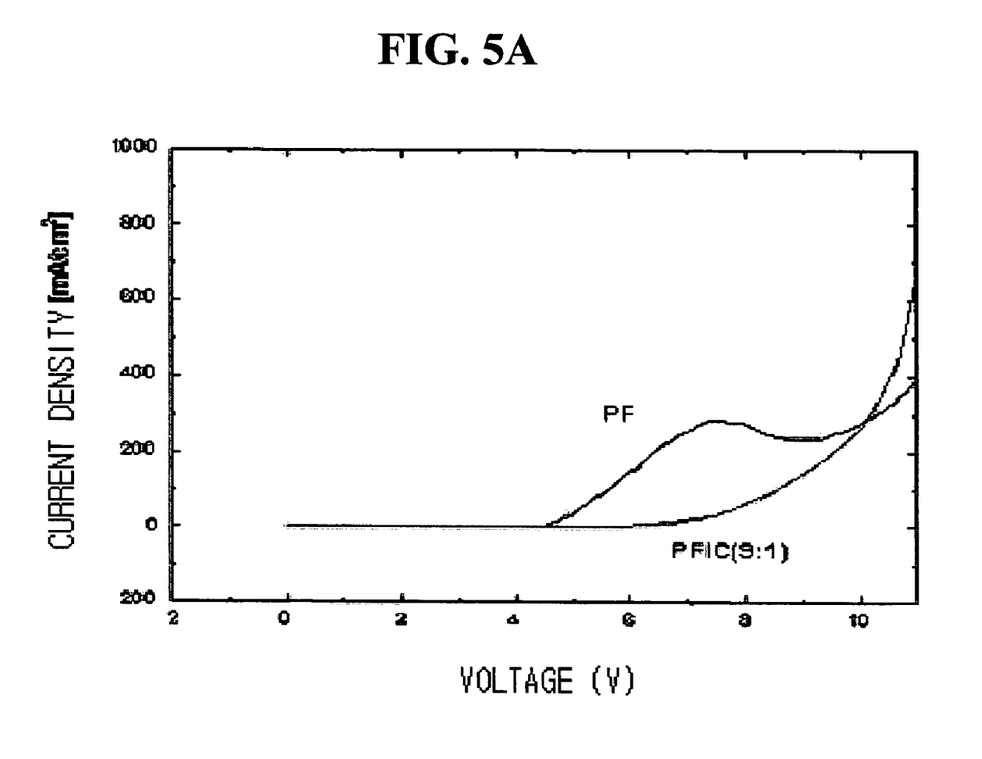
FIG. 5A is a graph of voltage versus current density for an organic EL device manufactured in Example 1.
Figure 5B:
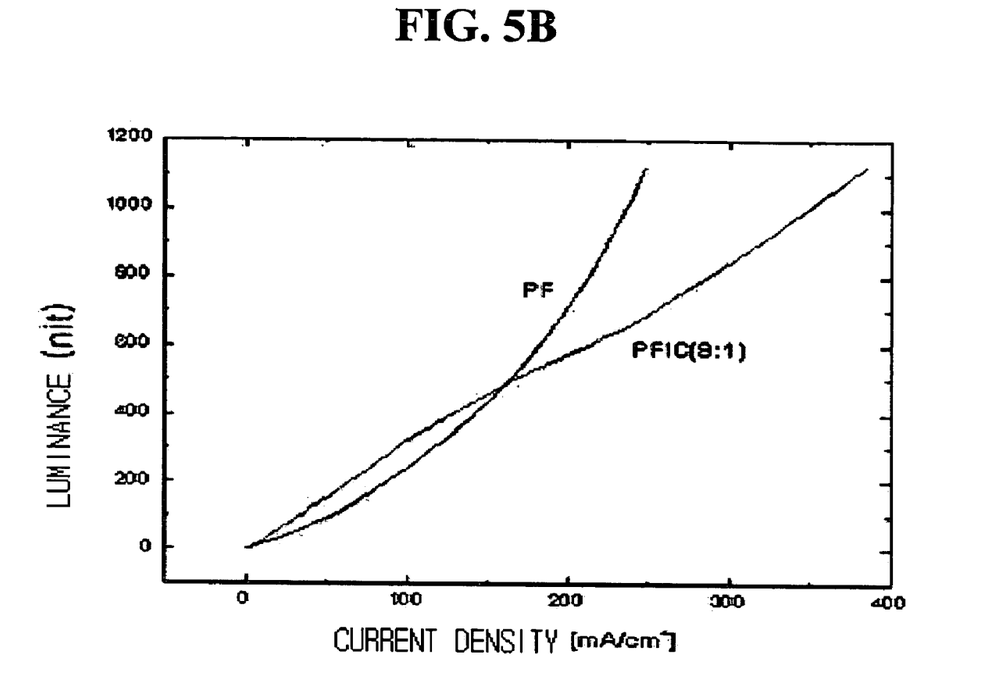
FIG. 5B is a graph of current density versus luminance for the organic EL device manufactured in Example 1.
Figure 6:
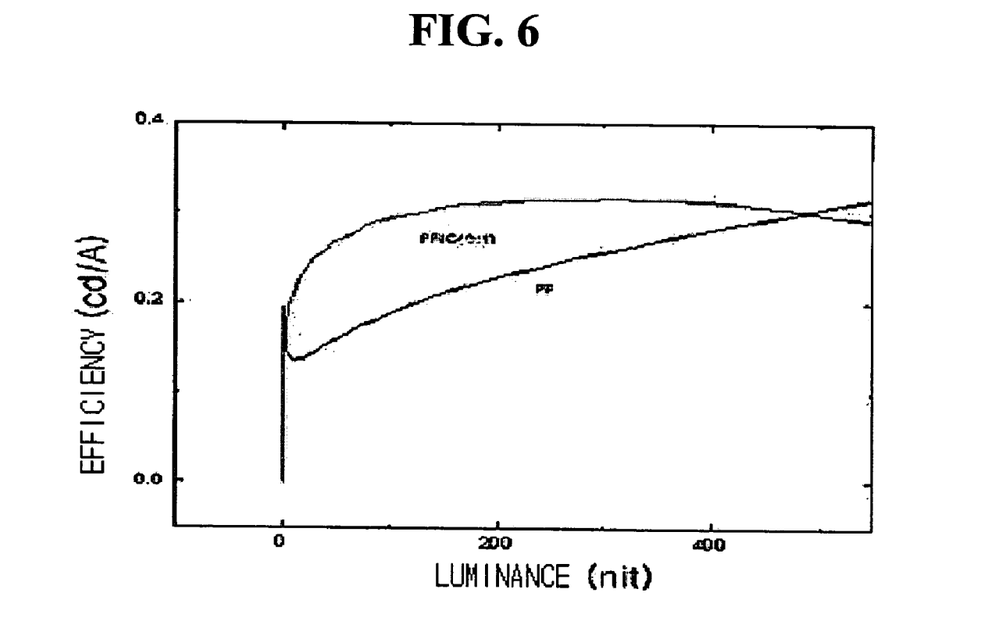
FIG. 6 is a graph of luminance versus efficiency for the organic EL device manufactured in Example 1.

Voltage-current density relationships and current density-luminance relationships of the organic EL devices of Example 1 and Comparative Example 1 were investigated, and the results thereof are shown in FIGS. 5A, 5B and 6.

Referring to FIGS. 5A, 5B and 6, the organic EL devices of Example 1 and Comparative Example 1 exhibited typical rectifying diode's characteristics. In particular, the organic EL device employing the polymer prepared in Example 1 exhibited good stability even after repeated driving cycles, that is, voltage-current density characteristics were maintained at initial levels.

As described above, the polymer represented by formula 1 according to the present invention is useful as an intermediate in bio-material preparations. Also, the polymer represented by formula 1 according to the present invention has good charge transporting capability and blue electroluminescence. When the blue electroluminescent polymer according to the present invention is used for organic layers, an organic EL device with improved electroluminescence efficiency and color purity can be manufactured.

What is claimed is:

1. A polymer represented by formula 1:

<Formula 1> wherein:
Ar is selected from the group consisting of a substituted or unsubstituted $C_{6-30}$ aryl group and a substituted or unsubstituted $C_{2-30}$ heteroaryl group;
$R_1$, $R_2$, $R_3$ and $R_4$ are independently a hydrogen atom, a substituted or unsubstituted $C_{1-30}$ alkyl group, a substituted or unsubstituted $C_{1-30}$ alkoxy group, a substituted or unsubstituted $C_{6-30}$ aryl group, a substituted or unsubstituted $C_{6-30}$ arylalkyl group, a substituted or unsubstituted $C_{6-30}$ aryloxy group, a substituted or unsubstituted $C_{2-30}$ heteroaryl group, a substituted or unsubstituted $C_{2-30}$ heteroarylalkyl group, a substituted or unsubstituted $C_{2-30}$ heteroaryloxy group, a substituted or unsubstituted $C_{5-20}$ cycloalkyl group, and a substituted or unsubstituted $C_{5-30}$ heterocycloalkyl group;

n is a real number between 0.01 and 0.99; and the polymer has a weight average molecular weight within the range of from about 10,000 to about 200,000 and a molecular weight distribution of 1.5 to 5.

2. The polymer of claim 1, wherein in formula 1, the arylene (Ar) unit is a group represented by one or more formula selected from the group consisting of:

(1h)

(1i)

(1j)

(1k)

(1m)

wherein $R_5$ and $R_6$ are independently selected from the group consisting of a hydrogen atom, a substituted or unsubstituted $C_{1-12}$ alkyl group, a substituted or unsubstituted $C_{1-12}$ alkoxy group and a substituted or unsubstituted amino group.

3. The polymer of claim 1, wherein the arylene (Ar) unit has an alkyl fluorene structure as represented by formula 1 k or 1 m,

(1k)

-continued (1m)

4. The polymer of claim 1, wherein the polymer is a compound represented by formula 2:

<Formula 2> wherein $R_1$, $R_2$, $R_7$ and $R_8$ are independently a $C_{1-12}$ alkyl group, and n is a real number between 0.01 and 0.99.

5. An organic EL device comprising an organic layer positioned between a pair of electrodes, the organic layer comprising the polymer of claim 1.

6. The organic EL device of claim 5, wherein the organic layer is an emissive layer or a hole transport layer.

7. The organic EL device of claim 5, wherein in formula 1, the arylene (Ar) unit is a group represented by one or more formula selected from the group consisting of:

(1a)

(1b)

(1c)

(1d)

(1e)

(1f)

(1g)

(1h)

(1i)

(1j)

-continued (1k)

(1m)

wherein $R_5$ and $R_5$ are independently selected from the group consisting of a hydrogen atom, a substituted or unsubstituted $C_{1-12}$ alkyl group, a substituted or unsubstituted $C_{1-12}$ alkoxy group and a substituted or unsubstituted amino group.

8. The organic EL device of claim 5, wherein the polymer is a compound represented by formula 2:

<Formula 2> wherein $R_1$, $R_2$, $R_7$ and $R_8$ are independently a $C_{1-12}$ alkyl group, and n is a real number between 0.01 and 0.99.

* * * * *